United States Patent [19]
Hintermaier et al.

[11] Patent Number: 6,120,846
[45] Date of Patent: Sep. 19, 2000

[54] METHOD FOR THE SELECTIVE DEPOSITION OF BISMUTH BASED FERROELECTRIC THIN FILMS BY CHEMICAL VAPOR DEPOSITION

[75] Inventors: Frank Hintermaier, Munich, Germany; Bryan Hendrix, Danbury, Conn.; Jeff Roeder, Brookfield, Conn.; Peter Van Buskirk, Newtown, Conn.; Thomas H. Baum, New Fairfield, Conn.

[73] Assignees: Advanced Technology Materials, Inc., Danbury, Conn.; Infineon Technologies Corporation, Cupertino, Calif.

[21] Appl. No.: 08/996,575

[22] Filed: Dec. 23, 1997

[51] Int. Cl.$^7$ .................. B05D 5/00; C23C 16/00
[52] U.S. Cl. .......... 427/269; 427/287; 427/256; 427/81; 427/255.7; 427/309; 427/248.1
[58] Field of Search .................. 427/256, 269, 427/287, 80, 81, 248.1, 255.1, 255.7, 255.2, 255.3, 309

[56] References Cited

U.S. PATENT DOCUMENTS

| | | | |
|---|---|---|---|
| 5,217,756 | 6/1993 | Shinzawa | 427/252 |
| 5,387,438 | 2/1995 | Werner et al. | 427/253 |
| 5,478,610 | 12/1995 | Desu et al. | 427/573 |
| 5,589,425 | 12/1996 | Hoshino et al. | 427/250 |

*Primary Examiner*—Roy V. King
*Attorney, Agent, or Firm*—Robert A. Whitman; Dexter K. Chin

[57] ABSTRACT

A method is described for the selective deposition of bismuth based ferroelectric films by selective chemical vapor deposition on a substrate. Selectivity in the deposition process is attained by selection of substrate-precursor combinations which assure high bismuth deposition efficiency in certain areas and low bismuth deposition efficiency in other areas in combination with specific process parameters.

33 Claims, 5 Drawing Sheets

METHOD FOR THE SELECTIVE DEPOSITION OF BISMUTH BASED FERROELECTRIC THIN FILMS BY CHEMICAL VAPOR DEPOSITION

FIELD OF THE INVENTION

This invention relates to a method for the selective deposition of bismuth based ceramic thin films. More specifically, the present invention relates to the preparation of bismuth based ferroelectric thin films by selective chemical vapor deposition.

BACKGROUND OF THE INVENTION

In recent years, there has been a increasing interest in a class of materials commonly referred to as ferroelectric materials which have found wide use in random access memory applications. In such applications, it has been common to employ ferroelectric capacitors which typically evidence high remanent polarization, small size, low leakage current and low fatigue rate. Accordingly, workers in the art have focused their interest upon the development of suitable techniques for the growth of ferroelectric thin films with optimum characteristics.

Among the earliest materials investigated for such applications were the perovskite ferroelectrics such as $PbZr_{1-x}Ti_xO_3$, commonly known as PZT. Unfortunately, the techniques employed for the preparation of these materials have resulted in the formation of defects which alter the stoichiometry due to the creation of vacancies. As a result of these difficulties, degradation problems such as fatigue, aging and leakage currents which adversely affect the device lifetime often occur.

More recently, workers in the art focused their interest upon the preparation of $SrBi_2Ta_2O_9$ (SBT) films using metallorganic vapor deposition techniques. Thus, for example, Desu et al. in U.S. Pat. No. 5,527,567 disclosed a method for the deposition by chemical vapor deposition techniques of high quality layered structured oxide ferroelectric thin films. These films were deposited at temperatures ranging from 450–800° C. The patentees specifically noted that at temperatures greater than 650° C. poor quality films were produced whereas at temperatures less than 600° C. excellent quality films were obtained. However, the use of the lower temperatures was found to lower the deposition rate, thereby necessitating a two step deposition with a short term deposition at temperatures ranging from 450–600° C. and a longer term deposition at temperatures ranging from 600–700° C.

Desu et al. further discovered that in the one step deposition procedure using high temperatures, heterogeneous nucleation and grain growth frequently occurred on the polycrystalline material employed as the bottom electrode in the capacitor of interest. The films so produced evidenced a non-uniform crystalline structure having a rough surface morphology. The patentees found, however, that in the two step deposition process, the first step yielded a thin uniform nucleation layer with grain growth occurring at the top of the substrate which provided a homogeneous nucleation and grain growth condition for the second deposition step.

Although this prior art technique and related techniques described by workers in the art have enjoyed a limited level of success, they have not proven satisfactory in depositions involving the use of multiple substrates. Thus, for example, if two substrates such as platinum and silicon dioxide are present in a chemical vapor deposition process for the preparation of ferroelectric SBT thin films, deposition will occur on both substrates. The deposition of bismuth oxide adjacent to an electrode at high temperatures is undesirable because of the ability of bismuth to migrate into the substrate and react with the components of the substrate. Unfortunately, this end negates the ability to use such techniques for the deposition of ferroelectric media suitable for use in ferroelectric random access computer memories.

SUMMARY OF THE INVENTION

In accordance with the present invention, these prior art limitations have been effectively obviated by means of a novel processing sequence wherein selective deposition of bismuth based ceramic thin films such as SBT and its derivatives is effected by chemical vapor deposition upon a structure comprising an insulating substrate member having deposited upon a portion thereof a film of an electrically conductive material.

Selectivity in the deposition process is attained by selection of substrate/insulating material combinations which assure high $Bi_2O_3$ deposition efficiency on the electrically conductive material and low $Bi_2O_3$ deposition efficiency on the insulating material in combination with controlled process parameters.

Alternatively, selectivity in the deposition process may be effected by the use of an oxide phase during the time frame in which $Bi_2O_3$ deposition efficiency is high or by means of a thin auxiliary layer deposited upon the electrode.

BRIEF DESCRIPTION OF THE DRAWINGS

The invention will be more readily understood by reference to the following detailed description taken in conjunction with the accompanying drawing wherein:

FIGS. 2a, 2b, 2c, 2d, 2e and 2f are front elevational views in cross section of a ferroelectric capacitor prepared in accordance with the present invention.

FIG. 2b is a front elevational view in cross section of the structure of FIG. 2a after finishing the bottom electrode by patterning the two layers deposited in FIG. 2a;

FIGS. 3a, 3b, 3c and 3d are front elevational views in cross section of dissimilar capacitors prepared in accordance with the present invention.

DETAILED DESCRIPTION OF THE INVENTION

Figure 1A:
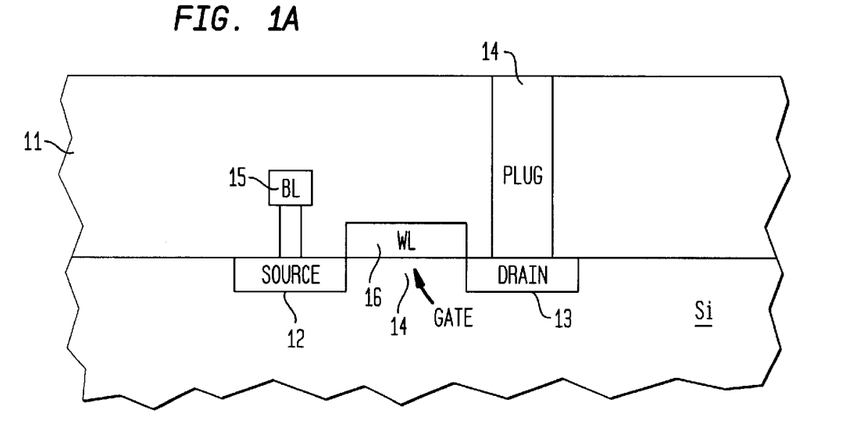
FIG. 1a is a front elevational view in cross-section of a typical FRAM cell including a CMOS transistor without a storage capacitor.

With reference now to FIG. 1a, there is shown a front elevational view in cross-section of a typical ferroelectric random access memory cell (FRAM). Shown in the figure is an insulating substrate 11, typically silicon dioxide ($SiO_2$) or silicon nitride ($Si_3N_4$), on top of a silicon substrate. At the interface between both substrates but embedded into the silicon substrate is a CMOS transistor including source 12, drain 13 and gate 14. Source 12 and gate 14 are connected to bit line 15 and word line 16, respectively. Drain 13 is connected to plug 14 which is designed to serve as connection to a stack capacitor having a bottom electrode, a ferroelectric layer and an upper electrode layer.

Figure 1B:
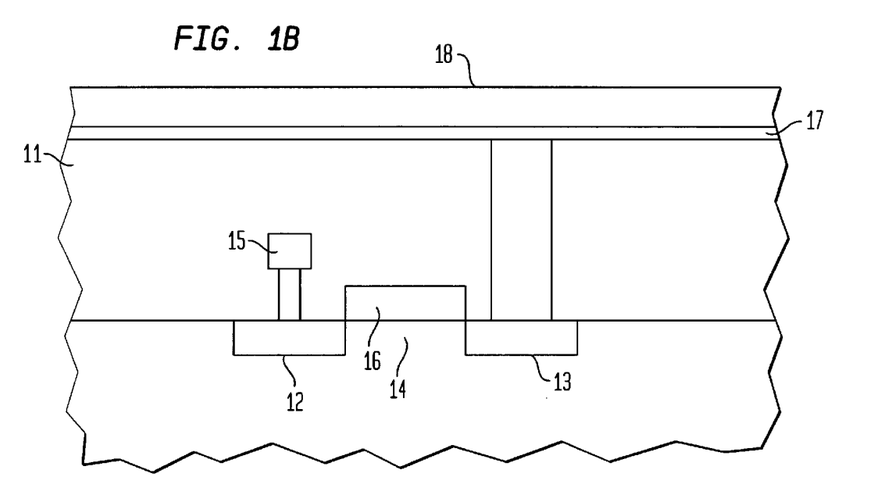
FIG. 1b is a front elevational view in cross section of the structure of FIG. 1a after the deposition thereon of a barrier layer and bottom electrode layer.

The vapor deposition process is normally effected at temperatures ranging from 400–700° C. in an oxygen containing ambient. In order to obviate oxidation of the plug, typically silicon or tungsten, during the processing, an oxygen barrier layer optionally may be deposited as an intermediate between the bottom electrode of the stack capacitor and the plug 14. FIG. 1b shows the structure of FIG. 1a after the deposition thereon of the optional barrier layer 17. Absent this barrier layer, there is a possibility that oxidation will occur, so resulting in the interruption of the electrical connection between the bottom electrode and the drain. Additionally, the barrier layer tends to preclude diffusion of atoms from the electrode or the ferroelectric material into the plug. Also shown in FIG. 1b is bottom electrode 18 of the capacitor, typically comprising a noble metal selected from among platinum, palladium, rhodium, gold and ruthenium, a conductive metal oxide selected from among ruthenium oxide, osmium oxide, rhenium oxide, rhodium oxide, iridium oxide, or mixed metal oxides such as LSCO, YBCO and metal nitrides such as titanium nitride or zirconium nitride.

The invention relates to the selective deposition of Bi-containing ferroelectric films. Such Bi-containing ferroelectric films are formed by, for example, using β-diketonate Bi precursor. The formation of Bi films with β-diketonate precursor is described in U.S. patent application Ser. No. 08/975,087, titled "Low Temperature Chemical Vapor Deposition Process For Forming Bismuth-Containing Ceramic Thin Film Useful In Ferroelectric Memory Devices", which was filed on Nov. 20, 1997 and in concurrently filed U.S. patent application Ser. No. 08/996,574, titled "METHOD FOR NUCLEATION CONTROLLED CHEMICAL VAPOR DEPOSITION OF METAL OXIDE FERROELECTRIC THIN FILMS", which was filed on Dec. 23, 1997, both herein incorporated by reference for all purposes.

Figure 1C:
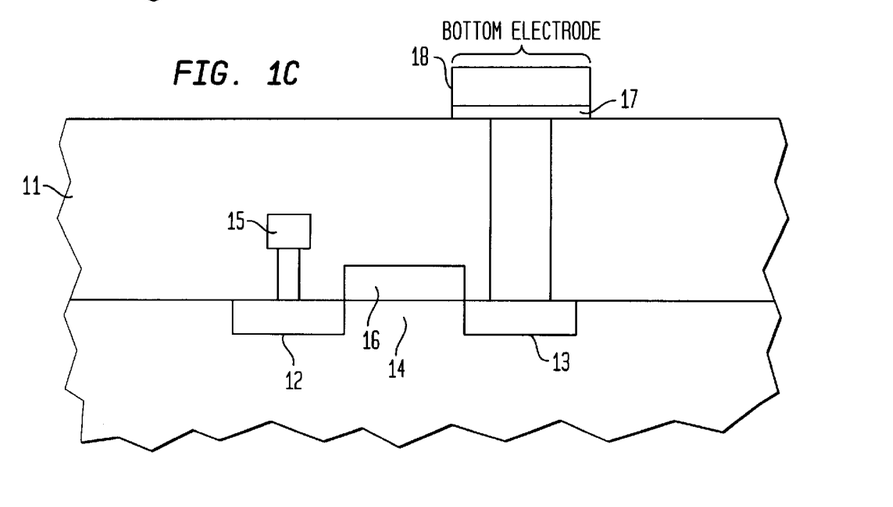
FIG. 1c is a front elevational view in cross section of the structure of FIG. 1b after the patterning of the bottom electrode layer.

The next step in the fabrication of the desired FRAM involves structuring the barrier layer and bottom electrode by conventional photolithographic techniques. The resultant structure is shown in FIG. 1c.

It is at this juncture that the novel process for the selective deposition of SBT is effected. As noted above, the presence of two substrates, that is, the bottom electrode 18 and the base member 11 in combination with specific processing parameters is the focus of the present invention. It is an object of the invention to assure that deposition of the SBT occurs preferentially on the bottom electrode and either does not deposit on the substrate base or does so to a limited extent. This end is enhanced by initially providing the bottom electrode with a high density of absorption sites and choosing an electrode material which is catalytically active. Each of these characteristics will assure high deposition rates for bismuth oxide. Noble metals and alloys containing noble metals or oxides of the type alluded to hereinabove are suitable for this purpose. Additionally, roughening the surface of the bottom electrode as for example, by sputter etching, chemical post treatment, etching, etc., and physical or chemical pretreatment are suitable for this purpose. The bottom electrode so treated has a large number of absorption sites which will enhance the selectivity of the SBT deposition. The base substrate offers a small number of absorption sites and is not catalytically active under the chemical vapor deposition conditions. Typical materials found useful for this purpose are silicon dioxide, silicon nitride and certain metal oxides which are non-conducting oxides such as tantalum pentoxide and strontium titanium oxide ($SrTiO_3$).

The selection of a precursor is perhaps the most significant factor in the metal oxide chemical vapor deposition processing. Materials suitable for this purpose evidence high vapor pressures at low vaporization temperature, low decomposition temperature at the substrate and stability under ambient conditions. The metalorganic compounds found suitable for selective deposition are in the bismuth family and are chosen from among triphenyl bismuth Bi(Ph)$_3$, tritolylbismuth Bi(Ph-Me) (ortho, meta or para) as well as other mono or multiple substituted aryl bismuth compounds. Additionally, other bismuth precursors may be suitable in providing for the desired selectivity depending upon the substrate combination chosen and the process parameters. Potential bismuth precursors for this purpose are bismuth alkyls, bismuth alkoxides, bismuth carboxylates, bismuth b-diketonates, bismuth amides and mixed ligand bismuth compounds.

Deposition of the desired materials may be effected in a conventional chemical vapor deposition apparatus, as for example, a warm wall reactor. The substrates are placed in the reaction chamber which is then sealed and the system evacuated to a pressure ranging from about 0.1 to 10 torr. The chamber and the substrate member are then heated to a temperature ranging from about 500–700° C. with a gas flow ranging from about 500–5000 sccm. Chemical precursors found to be particularly well suited for the chemical vapor deposition of $SrBi_2Ta_2O_9$ are bismuth triphenyl Bi(Ph)3, $Sr(thd)_2$-tetraglyme and $Ta(O-i-Pr)_4(thd)$ dissolved in tetrahydrofuran, isopropyl alcohol and tetragylme (THF:IPA:tetraglyme). A suitable volume ratio for the solvent components in the solvent composition may be an 8:2:1 volume ratio. Precursor solutions are mixed prior to deposition and flash evaporated upon a heated matrix. Typical vaporizer temperatures range from about 200–250° C. A preferred temperature for this step is about 210° C. The precursor vapor is then transported at a flow rate ranging from about 50–600 sccm. and preferably within the range of about 200 to 400 sccm. by a suitable carrier gas, such as argon, to the reaction chamber. The liquid delivery rate should range from about 0.05 to 1 milliliter per minute with a preferred range of about 0.07 to 0.25 milliliters per minute. At the inlet of the chamber, it is mixed further with argon and oxygen. Coating of the substrate is then effected. As noted, selectivity in the deposition of the precursors is essential in the practice of the present invention. Studies have revealed that optimum selectivity may be achieved at gas flows within the range of about 1000–1600 sccm. Studies have revealed that a high efficiency in the selectivity may be attained by operation of the process in accordance with the temperature and deposition reactor partial pressure ranges as set forth in Table 1.

TABLE 1

| Temperature (° C.) | Pressure (torr) |
|---|---|
| 650–670 | 0.1–7.0 |
| 600–650 | 0.1–5.0 |
| 550–600 | 0.1–2.0 |
| 500–550 | 0.1–0.5 |

Figure 4:
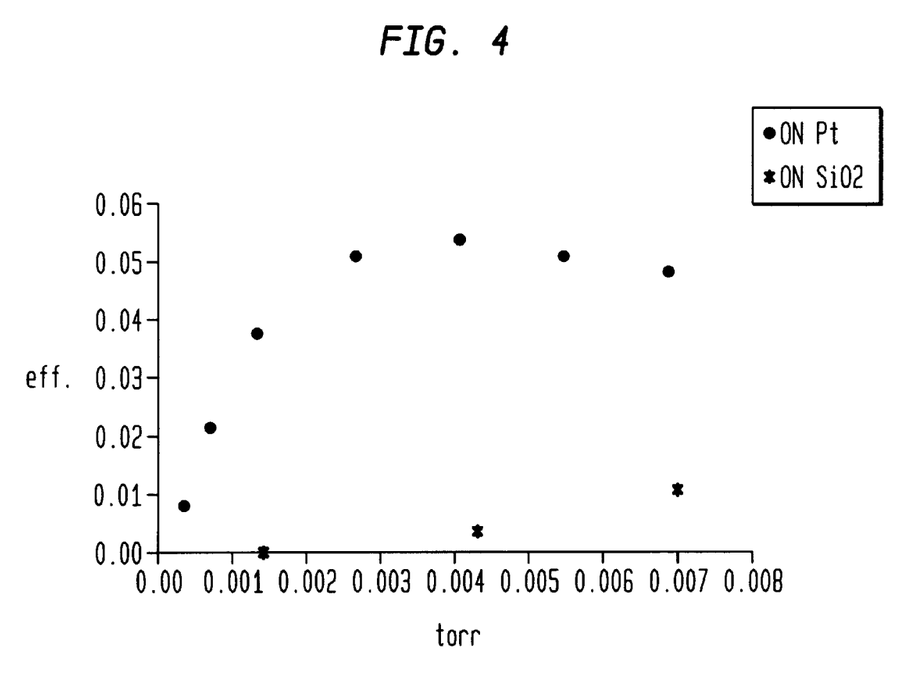
FIG. 4 is a graphical representation on coordinates of bismuth triphenyl partial pressure in torr against bismuth deposition efficiency showing the effect of variations in partial pressure upon the selectivity of deposition of bismuth oxide upon platinum and silicon dioxide substrates.

With regard to the deposition of $Bi_2O_3$, the parameter of greatest import is the partial pressure of the triphenylbismuth precursor in the reaction chamber. This pressure is affected by the total pressure in the chamber, the amount of bismuth precursor evaporated in the vaporizer and the total gas flow. A fuller understanding of the significance of this advance will be had by reference to FIG. 4 which is a graphical representation on coordinates of bismuth triphenyl against deposition efficiency. It will be noted from the graph that bismuth oxide deposition occurs at a high rate upon a platinum substrate above a partial pressure of about 0.0025 torr whereas the deposition rate on silicon dioxide remains at a low level up to about 0.007 torr. It is within this partial pressure window that selective deposition by chemical vapor deposition occurs.

Figure 1D:
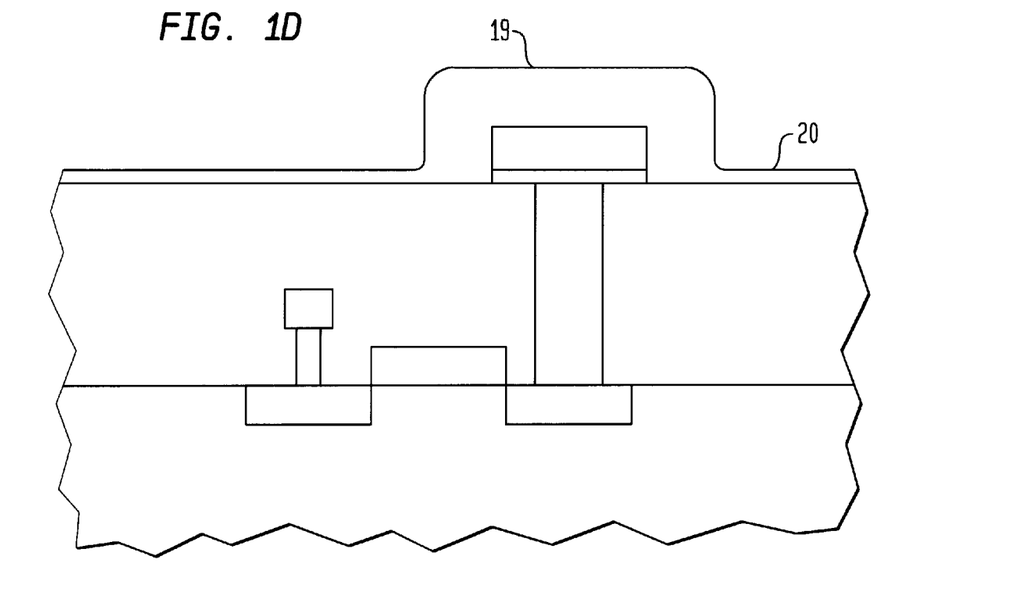
FIG. 1d is a front elevational view in cross section of the structure of FIG. 1c after the selective chemical vapor deposition of a $SrBi_2Ta_2O_9$ (SBT) layer and a strontium tantalate layer.

Shown in FIG. 1d is the structure of FIG. 1c after the selective chemical vapor deposition of an $SrBi_2Ta_2O_9$ (SBT) top electrode layer 19 and a strontium tantalate layer 20 on top of the surrounding insulating material which is silicon dioxide or silicon nitride.

Figure 1E:
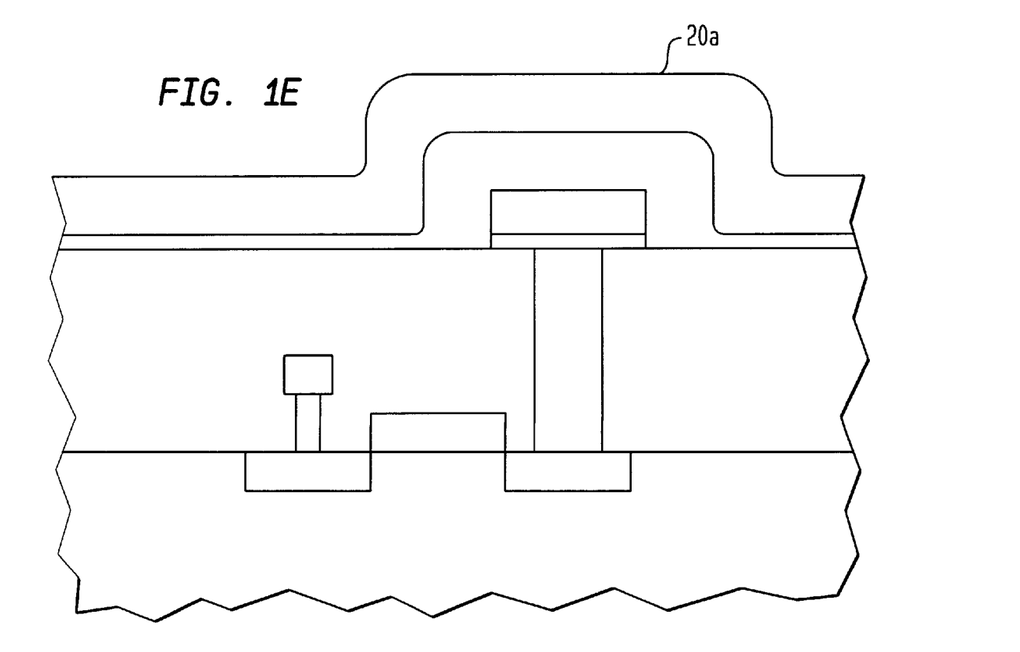
FIG. 1e is a front elevational view in cross section of the structure of FIG. 1d after the deposition thereon of a top electrode.

Following, the resultant structure is subjected to a high temperature anneal in the presence of oxygen to transform the as-deposited phase to the ferroelectric Aurivillius phase. Typically the anneal is performed at a temperature from about 600–820° C., preferably 750–800° C. Then, a top electrode 20a, typically a noble metal electrode, is deposited upon the structure shown in FIG. 1d to yield the structure shown in FIG. 1e. At that juncture, a further high temperature anneal is effected in the presence of oxygen. This top electrode will then serve as the common plate for capacitors.

An example of the practice of the present invention is set forth below. It will be understood by those skilled in the art that this example is for purposes of exposition only and is not to be construed as limiting.

EXAMPLE

The substrate chosen for use is a silicon dioxide matrix (TEOS) having a platinum electrode (1×1 mm²). The precursors employed were $Sr(thd)_2$ (tetraglyme), Ta(thd) $(OiPr)_4$, and $BiPh_3$ (thd=2,2,6,6-tetramethylheptane-3,5-dionate, OiPr=isopropoxide, and Ph=phenyl). The solvent employed was tetrahydrofurane/isopropanol/tetraglyme in a ratio of 8:2:1. The concentrations of the precursors in this solvent system were about: 0.15 M Sr source, 0.4 M Ta source and 0.4 M Bi source. Each of the precursor solutions were stored separately and mixed prior to deposition. Following, the mixture of precursors was flash evaporated upon a matrix at a vaporization temperature of about 205° C. with a liquid delivery rate ranging from about 0.05 to 0.2 ml/min. The vaporized precursors were then were then transported by an argon carrier gas to the reaction chamber. At the inlet of the chamber, the precursor stream was mixed further with argon and oxygen. The CVD reactor was a warm walled reactor ($T_{wall}$ is about 200° C.) comprising a quartz tube having a diameter of about 12.5 cm. The substrate was arranged perpendicular to the gas flow and was heated to a temperature of about 620° C. Coating of the substrate was effected for 30 minutes. Following, the precursor delivery was stopped and the resultant structure permitted to cool in the argon/oxygen stream. Film thickness of the deposited film was approximately 80 nm.

Analysis of the resultant structure will reveal that $Bi_2O_3$ is only deposited in those areas in which it is needed to form the ferroelectric SBT phase, namely on top of the bottom electrode. The insulating material that surrounds the bottom electrode is not covered with $Bi_2O_3$ but instead covered only with SrO and $Ta_2O_5$. The significance of this finding is as follows. First, $Bi_2O_3$ is known to react with $SiO_2$ to form bismuth silicates. Thus, if we have TEOS-$SiO_2$ beside the bottom electrode it would be transformed into a silicate. This will affect the stress in the entire wafer and increase the likelihood of the silicate density being different from that of TEOS-$SiO_2$. Additionally, such a change in density might be accompanied by void formation.

Additionally, when strontium tantalate is deposited upon the silicon dioxide or silicon nitride surface an etching step to remove it becomes unnecessary because strontium tantalate is an inactive material. However, with SBT covering the entire substrate, an etching step to remove the SBT from other places than the bottom electrode is likely to be required because of the high mobility of the bismuth.

Lastly, the use of a bismuth barrier layer on top of the insulating substrate surrounding the bottom electrode might not be necessary any more, thereby obviating the need for several process steps. Integration of certain high permittivity or ferroelectric dielectrics is complicated by the presence of highly mobile species such as bismuth (in SBT) or lead (in PZT). These species are highly reactive with typical isolation dielectrics such as silicon dioxide or silicon nitride, and interdiffusion of the bismuth or lead containing layer with these substrate layers greatly complicates subsequent processing because the interdiffusion will impair the mechanical and electrical properties of the substrate. In the selective CVD process for SBT, only strontium and tantalum are deposited upon the silicon oxide surface, and the resultant strontium tantalum oxide layer is stable and will maintain excellent properties on the silica surface. The advantage of this selectivity is to reduce the number of processing steps required to form an integrated structure and to reduce the number of deposition processes required, particularly in light of the fact that it is likely that a unique material such as titania might be required to form a diffusion barrier in the absence of the selective process.

Figure 2A:
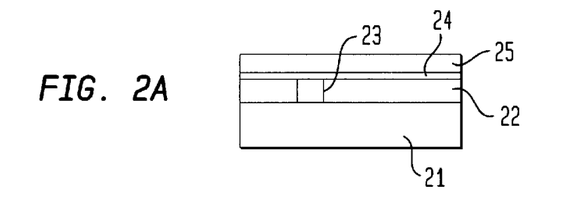
FIG. 2a is a front elevational view in cross section of a substrate member after deposition thereon of a barrier layer and a layer of a material comprising a bottom electrode.
Figure 2B:
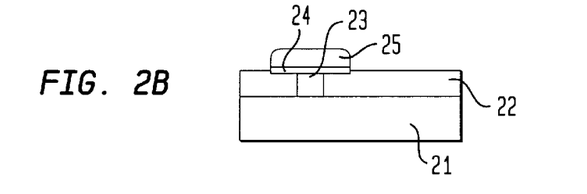
Figure 2C:
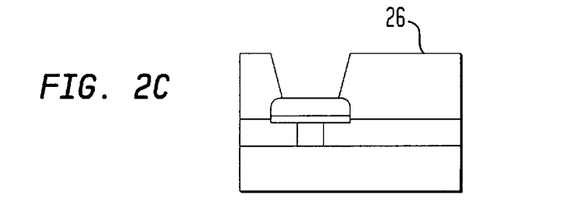
FIG. 2c is a front elevational view in cross section of the structure of FIG. 2b after depositing and patterning an auxiliary dielectric from a material on which $Bi_2O_3$ has a low deposition rate.
Figure 2D:
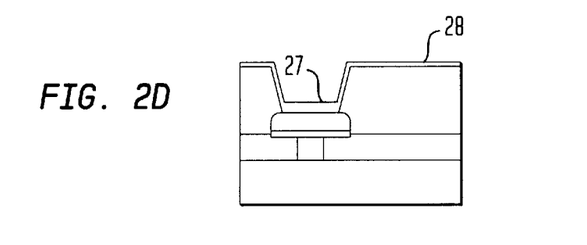
FIG. 2d is a front elevational view in cross section of the structure of FIG. 2c after the chemical vapor deposition of SBT upon the bottom electrode and of strontium tantalate ($SrTa_2O_6$) upon the auxiliary dielectric layer.

A still further advantage resulting from the practice of the present invention resides in the simplified process for the formation of a ferroelectric capacitor as shown in FIG. 2. FIG. 2a is a front elevational view in cross section of a silicon substrate 21 having deposited thereon an isolation dielectric 22, for example, silicon dioxide ($SiO_2$) or silicon nitride ($Si_3N_4$), which includes contact plug 23. Deposited upon the isolation dielectric is barrier layer 24 and bottom electrode 25 of the type described above;

The next step in the process involves patterning the bottom electrode and barrier layer by conventional photolithographic techniques. The resultant structure is shown in FIG. 2b. Then, an interlevel dielectric layer 26 is deposited upon the structure and patterned by conventional photolithographic techniques. (FIG. 2c). Following, a ferroelectric layer 27, shown in FIG. 2d, is deposited selectively in the manner described above to yield a ferroelectric material over the bottom electrode 25 comprising $SrBi_2Ta_2O_9$ (SBT). In the regions over insulating surfaces 26, the layer 28 is not a ferroelectric and contains strontium and tantalum oxides which have excellent physical and chemical integrity and which does not require a barrier layer to prevent bismuth diffusion.

Figure 2E:
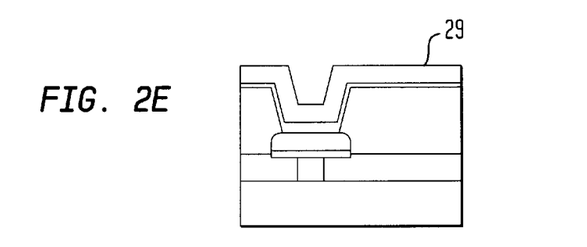
FIG. 2e is a front elevational view in cross section of the structure of FIG. 2d after the deposition of a layer of a top electrode material.
Figure 2F:
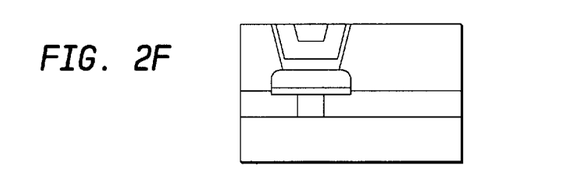
FIG. 2f is a front elevational view in cross section of the structure of FIG. 2e after leveling or planarization of the structure.

FIG. 2e shows the structure of FIG. 2d after the deposition thereon of a top electrode 29 of the type described. When this layer is the common plate, the capacitor is complete. If desired the structure may be processed further by patterning the top electrode 29 by chemical mechanical polishing, as shown in FIG. 2f.

It will be appreciated by those skilled in the art that removal of unwanted dielectric film over the isolation dielectric is more economical because there is less material in those locations, and because the physical and chemical integrity of the dielectric layer there, namely strontium and tantalum oxides, is superior to the situation existing where the bismuth containing SBT layer is present over the silicon oxide or nitride.

Figure 3A:
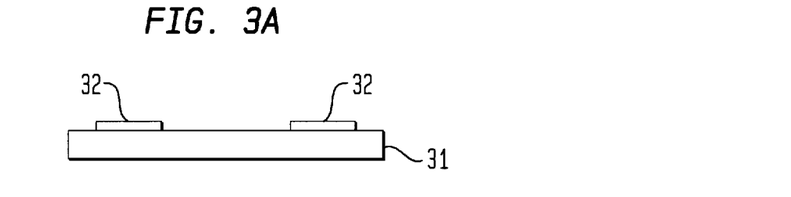
FIG. 3a is a front elevational view in cross section of the structure of a substrate member after the deposition thereon of a patterned platinum lower electrode.
Figure 3B:
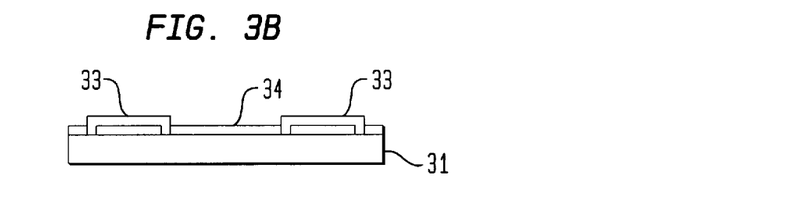
FIG. 3b is a front elevational view in cross section of the structure of FIG. 3a after the deposition thereon by selective chemical vapor deposition of an $SrBi_2Ta_2O_9$ (SBT) layer and a strontium tantalate layer.
Figure 3C:
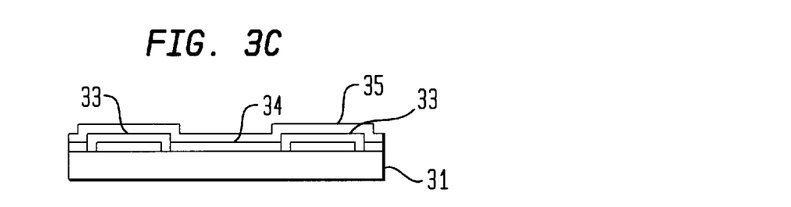
FIG. 3c is a front elevational view in cross section of the structure of FIG. 3b after the deposition thereon of a top platinum electrode.
Figure 3D:
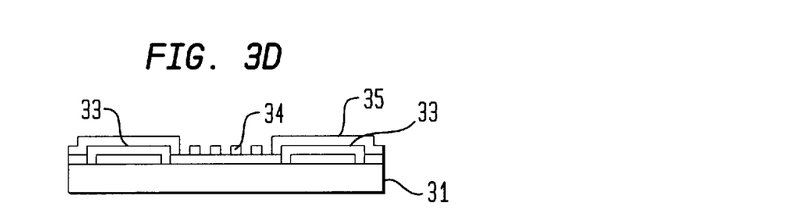
FIG. 3d is a front elevational view in cross section of the structure of FIG. 3c after the patterning of the top electrode.
Figure 3E:
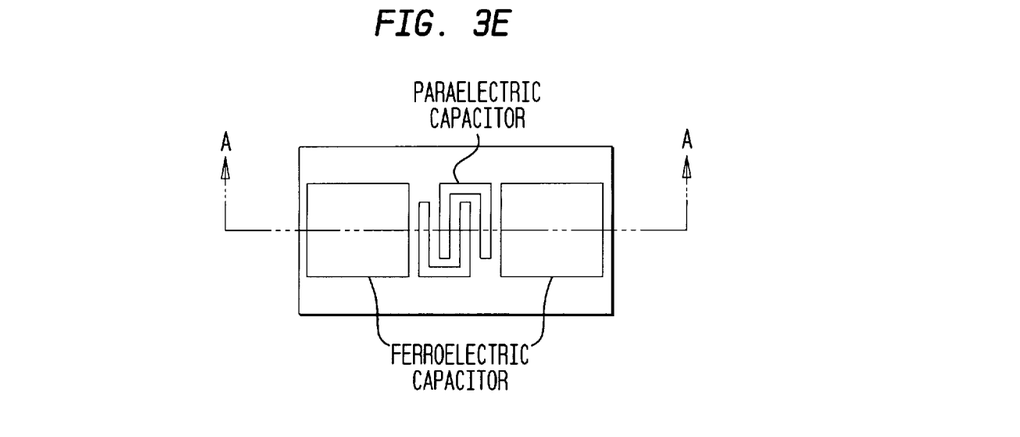
FIG. 3e is plan view through section A—A of a device layout embodying the capacitors shown in FIG. 3d.

The present invention may also be of interest in the fabrication of dissimilar capacitors in integrated circuits. Thus, for example, if the lower electrode is patterned before deposition leaving areas of field oxide, ferroelectric SBT ($SrBi_2Ta_2O_9$) will be formed on the Pt electrodes and non-ferroelectric Sr-Ta-O will be deposited on the field oxide. This processing sequence will be more fully understood by reference to FIGS. 3a–3e. Shown in FIG. 3a is a substrate member 31 having deposited thereon and patterned a platinum electrode 32.

The next step in this process involves the selective deposition of $SrBi_2Ta_2O_9$ in accordance with the present invention. This results in the deposition of SBT films 33 on platinum electrodes 32 and a strontium tanatalate layer 34 on substrate 31 shown in FIG. 3b. Thereafter, a top electrode 35, typically platinum, is deposited upon the structure of FIG. 3b to yield the structure of FIG. 3c. At this juncture, top electrode 35 is patterned to yield the structure of FIG. 3d. The cross-sectional FIGS. 3a–3d are taken through section A—A of the top view of a device layout shown in FIG. 3e.

By using interdigitated electrode structures, non-ferroelectric capacitors may be formed intermediate to the lower electrode areas over a field oxide. This approach permits the fabrication in one oxide deposition step of dissimilar (ferroelectric and non-ferroelectric) capacitors. The ferroelectric capacitor cells can then be used for non-volatile memory while the non-ferroelectric capacitors will have inherently lower dielectric losses so that the non-ferroelectric capacitors can be used for other parts of the device system requiring lower dielectric losses.

While the invention has been described in detail in the foregoing specification and exemplary embodiment, it will be understood by those skilled in the art that the description has been for purposes of exposition only and is not to be construed as limiting. Thus, for example, the described technique may be used in a procedure wherein the electrically conductive layer is part of a semiconductive device or part of the storage capacitor of a memory device. Furthermore, the technique may be employed in the fabrication of ferroelectric and non-ferroelectric capacitors on the same device.

What is claimed is:

1. A method, comprising: simultaneously exposing an insulating portion and electrically conductive portion of a substrate member to a chemical vapor deposition process; and during such chemical vapor deposition process selectively chemical vapor depositing a bismuth based ferroelectric thin film on the electrically conductive portion.

2. A method for the selective deposition of a bismuth based ferroelectric film on a substrate member by metallorganic chemical vapor deposition, comprises:

placing the substrate member having the insulating and electrically conductive surfaces in a chemical vapor deposition apparatus;

heating the substrate to an elevated temperature within the apparatus;

simultaneously exposing the insulating and electrically conductive surfaces of the substrate member to vaporized metallorganic precursors including a bismuth precursor carried by an inert gas into said apparatus and thermally decomposing said precursors for a time period sufficient to deposit the bismuth based ferroelectric film on the electrically conductive surface and a non-ferroelectric metal oxide film on the insulating surface;

terminating the flow of said precursors; and removing the substrate from the apparatus.

3. The method in accordance with claim 2 wherein the thermal decomposition is effected at a temperature within the range of 400–700° C.

4. The method in accordance with claim 2 wherein the thermal decomposition is effected at a pressure ranging from 0.1 to 10 torr.

5. The method in accordance with claim 2 wherein the thermal decomposition is effected at a gas flow rate ranging from 100 to 20000 sccm.

6. The method in accordance with claim 2 wherein said ferroelectric film is $SrBi_2Ta_2O_9$ or derivatives thereof.

7. The method in accordance with claim 2 wherein said ferroelectric film is $Bi_4Ti_3O_{12}$ or derivatives thereof.

8. The method in accordance with claim 2 wherein the precursors are generated by evaporation of solid or liquid compositions which are carried to the vapor deposition apparatus by an inert carrier gas.

9. The method in accordance with claim 2 wherein the electrically conductive surface is a noble metal selected from the group consisting of platinum, palladium, rhodium, iridium, ruthenium, osmium and gold.

10. The method in accordance with claim 9 wherein the noble metal is deposited upon a layer of an insulating material.

11. The method in accordance with claim 9 wherein the noble metal is deposited upon a layer of a conducting material.

12. The method in accordance with claim 2 wherein the insulating surface is silicon dioxide.

13. The method in accordance with claim 2 wherein the insulating surface is silicon nitride.

14. The method in accordance with claim 11 wherein said conducting material is selected from the group consisting of titanium, tantalum, tungsten and doped silicon.

15. The method in accordance with claim 14 wherein a conducting barrier layer is deposited intermediate the noble metal and the conducting layer.

16. The method in accordance with claim 2 wherein the bismuth precursor is selected from the group consisting of triphenyl bismuth, tritolyl bismuth, bismuth alkyl, bismuth alkoxides, bismuth carboxylates, bismuth b-diketonates, bismuth amides, mixed ligand bismuth compound and mixtures thereof.

17. The method in accordance with claim 2 wherein the precursors comprise a mixture of strontium bis (β-diketonate), bismuth triphenyl and tantalum alkoxide β-diketonate.

18. The method in accordance with claim 2 wherein the precursors comprise a mixture of Sr2,2,5,5-tetramethylheptane-3,5-dionate as tetraglyme adduct, triphenyl bismuth and tantalum 2,2,5,5-tetramethylheptane-3,5-dionate tetrakis(isopropoxide).

19. The method in accordance with claim 2 wherein the deposited ferroelectric film is $SrBi2Ta_2O_9$ which has been subjected to a high temperature anneal in the presence of oxygen at a temperature ranging from 600–820° C.

20. The method in accordance with claim 2 wherein the substrate is heated to a temperature within the range of 650–670° C. at a pressure within the range of 0.1–7.0 torr.

21. The method in accordance with claim 2 wherein the substrate is heated to a temperature within the range of 600–650° C. at a pressure within the range of 0.1–5.0 torr.

22. The method in accordance with claim 2 wherein the substrate is heated to a temperature within the range of 550–600° C. at a pressure within the range of 0.1–2.0 torr.

23. The method in accordance with claim 2 wherein the substrate is heated to a temperature within the range of 500–550° C. at a pressure within the range of 0.1–0.5 torr.

24. The method in accordance with claim 2 wherein the precursor is delivered to the vapor deposition apparatus at a liquid delivery rate within the range of 0.05–1 milliliter per minute.

25. The method in accordance with claim 24 wherein the precursor delivery rate ranges from 0.07 to 0.20 milliliters per minute.

26. The method in accordance with claim 2 wherein the carrier gas flow ranges from 200–400 sccm.

27. The method in accordance with claim 19 wherein the $SrBi_2Ta_2O_9$ ferroelectric film is deposited upon a platinum electrically conductive surface and $SrTaO_x$ is deposited upon said insulating surface.

28. The method in accordance with claim 2 wherein another layer of a conductive material is deposited upon the chemical vapor deposited layer to form a capacitor.

29. A method, comprising:

providing a substrate having an insulating portion and a conductive portion;

simultaneously exposing the insulating portion and the conductive portion to chemically vapor deposition with such deposition selectively depositing a ferroelectric film over the conductive portion and a non-ferroelectric film over the insulating portion.

30. The method recited in claim 29 including processing the conductive portion to enhance absorption sites for the ferroelectric film deposition.

31. The method recited in claim 29 wherein the processing comprises roughening a surface of the conductive portion.

32. The method recited in claims 29 wherein the conductive portion is catalytically active.

33. The method recited in claims 29, 30, 31 or 32 wherein the chemical vapor deposition comprises depositing a bismuth containing ferroelectric film.

* * * * *